US006312768B1

(12) United States Patent
Rode et al.

(10) Patent No.: US 6,312,768 B1
(45) Date of Patent: Nov. 6, 2001

(54) METHOD OF DEPOSITION OF THIN FILMS OF AMORPHOUS AND CRYSTALLINE MICROSTRUCTURES BASED ON ULTRAFAST PULSED LASER DEPOSITION

(75) Inventors: Andrei Rode, Rivett (AU); Eugene Gamaly, Iztapalapa (MX); Barry Luther-Davies, Kambah (AU)

(73) Assignee: The Australian National University, Acton (AU)

( * ) Notice: Subject to any disclaimer, the term of this patent is extended or adjusted under 35 U.S.C. 154(b) by 0 days.

(21) Appl. No.: 09/508,346

(22) PCT Filed: Sep. 10, 1998

(86) PCT No.: PCT/AU98/00739

§ 371 Date: Jun. 21, 2000

§ 102(e) Date: Jun. 21, 2000

(87) PCT Pub. No.: WO99/13127

PCT Pub. Date: Mar. 18, 1999

(30) Foreign Application Priority Data

Sep. 11, 1997 (AU) .................................................. PO 9127

(51) Int. Cl.$^7$ ...................................................... C23C 14/30
(52) U.S. Cl. .................. 427/596; 427/249.1; 427/255.6; 427/294; 427/492; 427/554; 427/561
(58) Field of Search ..................................... 427/492, 554, 427/596, 597, 561, 249.1, 255.6, 294

(56) References Cited

U.S. PATENT DOCUMENTS 5,015,492   5/1991  Venkatesan et al. ..................... 427/8

FOREIGN PATENT DOCUMENTS

4228573 C1   2/1994  (DE) .
1272759     10/1989  (JP) .

OTHER PUBLICATIONS

A.V. Rhode et al., "Formation of cluster–assembled carbon nanofoam by high–repetition–rate laser ablation," *Applied Physics A*, 70(2):135–144, Feb. 2000.

(List continued on next page.)

*Primary Examiner*—Bernard Pianalto
(74) *Attorney, Agent, or Firm*—David V. Carlson; Seed IP Law Group, PLLC (57) ABSTRACT

Powerful nanosecond-range lasers using low repetition rate pulsed laser deposition produce numerous macroscopic size particles and droplets, which embed in thin film coatings. This problem has been addressed by lowering the pulse energy, keeping the laser intensity optional for evaporation, so that significant numbers of the macroscopic particles and droplets are no longer present in the evaporated plume. The result is deposition of evaporated plume on a substrate to form thin film of very high surface quality. Preferably, the laser pulses have a repetition rate to produce a continuous flow of evaporated material at the substrate. Pulse-range is typically picosecond and femtosecond and repetition rate kilohertz to hundreds of megahertz. The process may be carried out in the presence of a buffer gas, which may be inert or reactive, and the increased vapour density and therefore the collision frequency between evaporated atoms leads to the formation of nanostructured materials of increasing interest, because of their peculiar structural, electronic and mechanical properties. One of these is carbon nanotubes, which is a new form of carbon belonging to the fullerene ($C_{60}$) family. Carbon nanotubes are seamless, single or multishell co-axial cylindrical tubules with or without dome caps at the extremities. Typically diameters range from 1 nm to 50 nm with a length >1 $\mu$m. The electronic structure may be either metallic or semiconducting without any change in the chemical bonding or adding of dopant. In addition, the materials have application to a wide range of established thin film applications.

22 Claims, 7 Drawing Sheets

OTHER PUBLICATIONS

A.V. Rhode et al., "Structural analysis of a carbon foam formed by high pulse–rate laser ablation," *Applied Physics A*, 69[Suppl.]: S755–S758, 1999. (No month avail.).

E.G. Gamaly et al., "Single–walled carbon nanotubes formation with a continuous $CO_2$–laser: experiments and theory," *Applied Physics A*, 70(2):161–168, 2000. (No month avail.).

J. Bulíř et al. "Influence of deposition parameters on laser ablation deposited amorphous carbon," *Journal of NonCrystalline Solids*, 188:118–124, 1995. (No month avail.).

W. Kautek et al., "Pulsed–laser deposition and boron–blending of diamond–like carbon (DLC) thin films," *Applied Surface Science*, 106:158–165, 1996. (No month avail.).

METHOD OF DEPOSITION OF THIN FILMS OF AMORPHOUS AND CRYSTALLINE MICROSTRUCTURES BASED ON ULTRAFAST PULSED LASER DEPOSITION

TECHNICAL FIELD

This invention relates to the ultrafast laser deposition of various materials to form thin film of amorphous and crystalline structures, including nanometric structures.

BACKGROUND TO THE INVENTION

Pulsed laser deposition (PLD) in which pulses of laser radiation are used to evaporate material from a target which is then deposited on a substrate represents a breakthrough in methods for the production of technologically important thin films. Versatility and simplicity are essential features of pulsed laser deposition as a technique for depositing thin films of complex materials. Virtually any material, from pure elements to multicomponent and organic compounds can be deposited; and the stoichiometry of the target material is faithfully reproduced in the film.

Advantages of PLD stem from the fact that laser beams, unlike ion beams or electron beams, are easy to transport and manipulate, and the dynamic range of delivered energy is the largest compared to virtually any deposition process. As a result, PLD has the highest instantaneous deposition rate, up to 100 times higher than in other thin film deposition methods such as Chemical Vapour Deposition. Molecular Beam Epitaxy. Plasma Processing, Magnetron and RF Sputtering, and others. Nevertheless, pulsed laser deposition has not become widely used as a thin film production method for important technologies such as the semiconductor electronics industry or photonics, because of the creation of particulates during PLD which prevent the formation of suitably high quality films.

This major disadvantage is well known using conventional PLD methods, where it is normal to employ low repetition rate, powerful nanosecond-range laser pulses to evaporate the target. In this situation large numbers of macroscopic particles and droplets, having a typical size from a fraction of a micron to a few microns, are ejected from the target during the evaporation process. As a consequence, the convention PLD process cannot provide good surface quality or uniformity of the deposited films since these particles and droplets become embedded in the resulting film. The particulate problem severely limits the commercial applications of the existing pulsed laser deposition technique. In high-performance electronic and in optical applications such as optical thin film devices with sophisticated architecture, stringent constrains exist for surface smoothness; therefore the tolerance of particulate density and size is generally very low, in order<1 particle per $mm^2$.

DISCLOSURE OF THE INVENTION

It is an object of this invention to provide a laser deposition method to form a film with a surface substantially free of particulates and with exceptional surface quality.

In one broad form this invention provides a method of deposition of thin amorphous and structural films including the steps of sequentially evaporating small amounts of material to be deposited from a target of the material with each pulse of a laser irradiating the target, each pulse having an energy less than that required to evaporate sufficient of the material to result in a significant number of particles in the evaporated plume, and depositing the evaporated material on a substrate to form the film.

Preferably, the laser pulses have a repetition rate selected to produce a substantially continuous flow of evaporated material at the substrate.

This invention provides a method of laser deposition of amorphous or structural films with almost complete elimination of particles from the vapour plume thus resulting in deposition of thin films with very high surface quality. The method of this invention differs from the conventional PLD by the use of shorter laser pulses, typically picosecond and femtosecond pulse-range instead of nanosecond and much higher repetition rates, typically from kilohertz (kHz) to hundreds of megahertz (MHz) instead of tens of hertz (Hz). Furthermore the target is preferably evaporated by very low energy laser pulses and at an optimal laser intensity which depends on thermodynamic parameters of the target thus improving the efficiency of the evaporation process.

The invention provides a method of ultrafast laser ablation and deposition of thin amorphous or structural films by applying a succession of short laser pulses at high repetition rate for heating the target and generating successive bursts of atoms and/or ions in a vapour plume. Furthermore, as the laser repetition rate used increases, it is possible to reach a condition where a continuous beam of atoms strikes the substrate surface because the spread of atom velocities in the laser evaporated plume allows the slow atoms from one pulse to arrive at the same time as the faster atoms from later pulses. As a result, the film grows on the substrate surface from a continuous flow of atomic vapours with regulated atom flux density. This aids the creation of structured films, for example epitaxial growth. The method of this invention differs substantially from conventional PLD processes where the bursts of material from successive pulses arrive separately at the substrate.

A continuous flow can be established we recognize because of a spread of velocities exists for the material evaporated by a laser. The temperature at the evaporation surface is typically $5 \cdot 10^3 K$, depending on the target material. For graphite the average velocity $v_c$ for evaporated carbon atoms in the vapour flow will be $v_c = 2 \cdot 10^5$ cm/s, but the velocity of the expansion front is greater and is typically $\sim 3 v_c = 6 \cdot 10^5$ cm/s. This means that continuous flow of evaporated carbon atoms is formed at a distance $d = 1.5 \cdot v_c / R_{rep}$, here $R_{rep}$ is the minimum laser repetition rate. Thus, for typical target to substrate distance of 10 cm the minimum laser repetition rate for formation of continuous vapour is $R_{rep} = 30$ kHz. In order to create a homogeneous continuous vapour flow with low temporal and spatial modulation in vapour density near the substrate surface the actual laser repetition rate should be several times $R_{rep}$, suggesting MHz or greater rates are desirable.

Selection of an appropriate high repetition rate$>>R_{rep}$ then allows the flux of the atoms on the substrate surface to be fine tuned via small variations in the laser repetition rate, for example, permitting the deposition of single atomic layers of material. In convention PLD, where the number of evaporated atoms per pulse is up to ten orders of magnitude higher than for the present invention, such fine deposition control is not possible. Thus this invention overcomes prior art limitations in controlling the accuracy of the thickness of the deposited film.

The relationship between laser pulse characteristics such as time duration to, wavelength, laser intensity on the target surface and pulse repetition rate $R_{rep}$ from the one hand, and the target material characteristics such as density, specific heat, heat conduction, and heat of vaporisation from the other hand, allows selection of the optimal level of absorbed laser intensity $I_a$ for the most efficient evaporation of the target. The laser pulse length and the laser intensity are preferably selected according to the following relationship:

$$I_a t_p^{\frac{1}{2}} = a^{\frac{1}{2}} \rho_0 \Omega; \text{ where } a = \frac{K}{C_p \rho_0}; \quad (1)$$

here a is the thermal diffusion coefficient in [cm$^2$/s]; K the heat conduction coefficient in [J/(s·cm·K)], $C_p$ is specific heat [J/(g·K)], $\rho_0$ is target material density in [g/cm$^3$]; $\Omega = \epsilon_b/M$[J/g] is the heat of vaporisation, $\epsilon_b$ is the binding energy in [J], and M is the atomic mass of the target material in [g], and $I_a$ is in [W/cm$^2$]. Keeping the laser intensity close to the practical optimal intensity allows the most effective regime of evaporation to be achieved with minimal thermal loss into the target.

By reducing the laser pulse duration from the conventional nanosecond range to the picosecond or shorter timescale, the evaporation process takes place in an increasingly narrow zone near the target surface. There is thus insufficient time for thermal energy transport further into the target during the laser pulse. As a result, almost all the absorbed laser energy goes into evaporation of atoms from a very thin zone near the target surface. This means that less absorbed laser energy will be lost as waste heat. This is illustrated by rewriting equation 1 in terms of laser fluence $F_a$ $$I_a \cdot \sqrt{t_p} = \text{const} = \frac{F_a}{\sqrt{t_p}}; \quad (2)$$

here $F_a$ is in [J/cm$^2$]. Therefore, the transition from, for example, a 10 ns pulse to a 100 ps pulse. assuming that the laser evaporation is at the optimal regime in both cases according to equation 1, results in a 10 times decrease of the energy density needed to ablate the material. Thus, a transition to shorter pulse duration leads to an increase of the evaporation efficiency. The benefit of the use of short laser pulses becomes even more significant because they lead to elimination of particulates and droplets in the vapour flow. This occurs due the drastic decrease in the number of atoms evaporated by a single pulse. Typically conventional PLD in optimal conditions leads to the evaporation of $10^{19-20}$ atoms per pulse, sufficient to potentially generate $10^8$ micron sized particles. The present invention however, because it uses very low energy pulses produces only $\approx 10^{11}$ atoms per pulse, and this contains sufficient mass to potentially generate only a single micron sized particle leading to the almost total elimination of such particles on the deposited film. The decrease in the number of atoms evaporated during a single picosecond laser pulse by many orders of magnitude in comparison to that produced by powerful nanosecond pulse, thus avoids a major disadvantage of the conventional laser deposition method, namely the formation of particulates. The method of the present invention is able to maintain at least the same total mass deposition rate compared with the conventional PLD if required because the low number of atoms evaporated each pulse can be compensated by the use of a very high pulse repetition rates (kHz or MHz).

In the preferred embodiment of this invention, the laser pulses are scanned across the surface of the target during the evaporation process in order to keep the laser-target interaction in the regime of transparent vapours. This can be achieved by steering the laser beam or by movement of the target. The scanning of the irradiating laser beam across the target significantly improves the evaporation process. This is because if the laser pulses hit upon the same spot on the target surface a large crater is created in the target. In this context a large crater means that the crater depth is higher than the diameter of the crater. If the crater is formed, the target vapour can be captured in the crater in that it does not have enough time to get out of the crater before the arrival of the following laser pulse. If this occurs then the vapour absorbs some of the incoming laser radiation and reduces the laser energy delivered to the target surface for evaporation.

When the laser evaporation process occurs in the atmosphere of a buffer (inert or reactive) gas, the increased vapour density and thus the increased collision frequency between the evaporated atoms leads to the formation of nanostructured materials in the vapour plume. Nanoscale particles and clusters is subject of an increasing interest as a consequence of their peculiar structural, electronic, and mechanical properties. (The term "cluster" here refers to groups of bonded atoms on up to particles $\leq 100$ nm in diameter.) The physical and chemical properties of these objects are size specific so that they can be considered as building blocks for the synthesis of materials with tailored properties controlled by changing the size and composition of the primeval clusters. The method of this invention enables the synthesis of a new class of materials with selected engineered properties.

One of the examples of such new materials are carbon nanotubes, discovered in 1991, which is a new form of carbon belonging to the fullerene ($C_{60}$) family. Carbon nanotubes are seamless, single or multishell coaxial cylindrical tubules with or without dome-like caps at the ends. The tubes typically have diameters of 1 nm to 50 nm at a length greater than 1 $\mu$m. These nanotubes posses a variety of unique properties. Depending on the geometry and the size of a single-wall periodic structure, carbon nanotubes exhibit very peculiar electronic properties. The electronic structure can be either metallic or semiconducting, although there is no difference in the local chemical bonding between the carbon atoms in the nanotubes, and no doping impurities are present. Such carbon nanotubes could find an important application in future nanoelectronic devices.

The invention will be further described, by way of example only, with reference to the accompanying drawings and some examples.

BEST MODES FOR CARRYING OUT THE INVENTION

Figure 1:
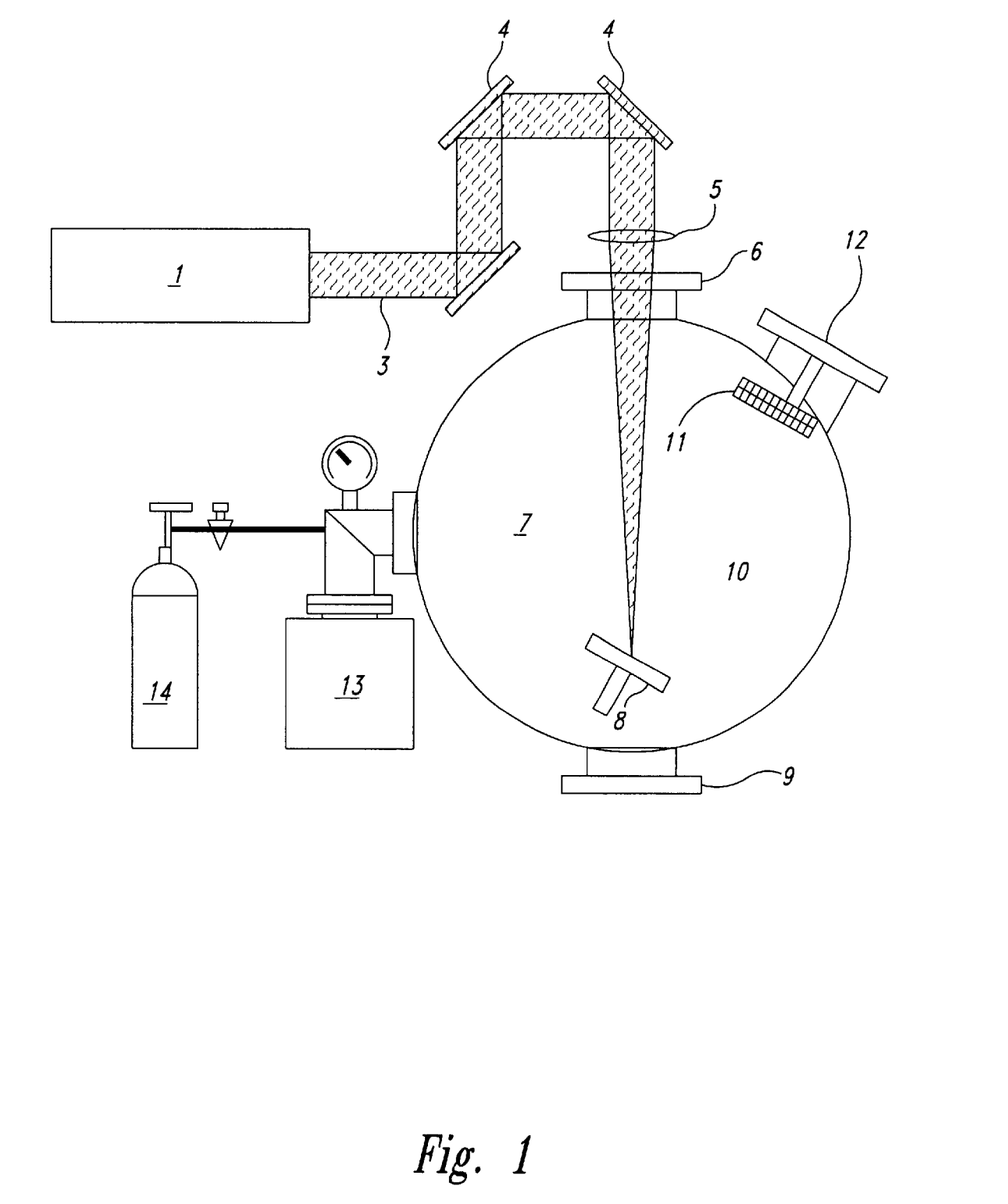
FIG. 1 is a schematic illustration of a laser evaporation and deposition system according to this invention.

FIG. 1 shows a laser evaporation and deposition system according to the invention. The system includes a high repetition rate pulsed laser 1 which produces a laser beam 3 that is directed by a series of mirrors 4, a focusing lens 5 and a laser window 6 to a vacuum chamber 7. The mirrors 4 to provide a beam scanning system. The laser beam 3 is directed to a target 8 within the vacuum chamber 7. A plume of evaporated atoms is transported to a substrate 11 which may include a heating system. A target port 9 and substrate port 12 are provided for viewing the target and substrate respectively A vacuum pumping system 13 and a gas filling station 14 are connected with the vacuum chamber 7.

A versatile laser deposition system can also include a laser frequency conversion system, a laser beam scanning system, special telecentric focusing optics, target manipulation system, substrate holder and heater, film thickness monitoring system, vacuum load locks, pumping system with vacuum gauging and a gas filling and flow system.

The method of this invention is illustrated in the following results based on the evaporation of carbon using either a 10 kHz, 120 ns Q-switched Nd:YAG laser, or a 76 MHz 60 ps mode-locked Nd:YAG laser. Some of the results,such as particulate density on the film surface, are compared to those obtained with conventional pulsed laser deposition technique using a 20 ns, 25 Hz, Q-switched laser. Graphite was chosen as the target material for testing the high repetition rate laser ablation method because carbon is one of the most refractory materials in Nature, so that the demonstration of effective carbon evaporation would serve as an illustration of the possibility at evaporating almost all other materials which absorb laser radiation reasonably well.

EXAMPLE 1

The Number of Evaporated Atoms

This example compares an estimate of the number of evaporated atoms or molecules per laser pulse for three different lasers with various repetition rates. To provide a meaningful comparison the optimal regime for carbon evaporation for each laser is considered for evaporation that takes place in vacuum. The vapour temperature along with the evaporation rate is proportional to the product $I_a \cdot (t_p)^{1/2}$ and remains constant in the optimal evaporation regime. The maximum number of the evaporated atoms per single pulse $$N_{evap} = E_p/\epsilon_b = I_a S_{foc} t_p/\epsilon_b$$

1) conventional low repetition rate, high power laser: repetition rate $R_{rep}$=25 Hz; $t_p$=10 ns; pulse energy 0.05 J; absorbed laser intensity $I_a$~2·10$^9$ W/cm$^2$; $S_{foc}$~1 cm$^2$. The number of evaporated atoms is ~10$^{17}$ atoms/pulse;
2) high repetition rate laser, long pulse: $R_{rep}$=10 kHz; $t_p$=120 ns; pulse energy $E_p$=2.5 mJ; $I_a$~6·10$^8$ W/cm$^2$; $S_{foc}$~10$^{-4}$ cm$^2$. The number of evaporated atoms is ~4 10$^{15}$ atoms/pulse;
3) ultrahigh repetition rate laser, short pulse: $R_{rep}$=76 MHz; $t_p$=60 ps; pulse energy $E_p$=0.3 μJ; $I_a$~2·10$^{10}$ W/cm$^2$; $S_{foc}$~3·10$^{-7}$ cm$^2$. The number of evaporated atoms is ~5 10$^{11}$ atoms/pulse.

Thus, the maximum number of evaporated carbon atoms per single 60 ps laser pulse is more than five orders of magnitude less than for conventional 10 ns pulse laser. This means that in vacuum the formation of micron size particulates is virtually impossible with picosecond lasers, because a μm sized particle consists of about >10$_{11}$ carbon atoms. Put very simply, the number of atoms evaporated per pulse is too low to form such a particle.

Since the probability of the total evaporated mass per pulse agglomerating to form a single particle is very low, the upper limit in $N_{evap}$ before a significant number of particles are likely to be present in the evaporated plume is about 10$^{13-14}$ atoms per pulse.

Figure 2A:
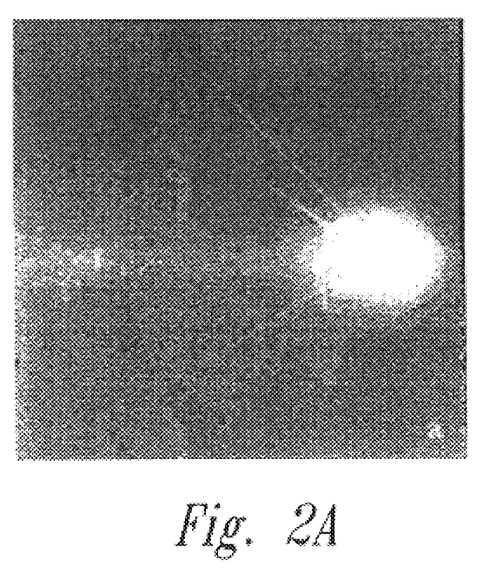
FIGS. 2(a) and 2(b) are laser plume images in experiments with 10 kHz and 76 kHz lasers respectively.
Figure 2B:
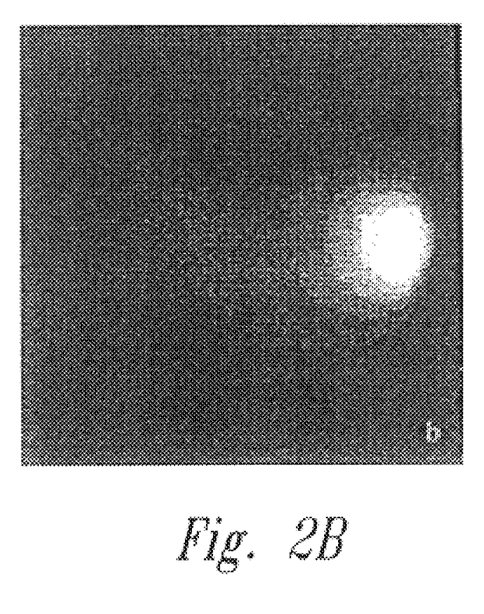

This absence of particles in plumes created using very short laser pulses is illustrated on the laser plume images shown on FIG. 2(a,b). The FIG. 2(a) image is the laser plume with 10 kHz repetition rate laser acquired over ~300 pulses (0.03 s). Tracks of hot particles are still quite evident in the plume even after such averaging. The FIG. 2(b) image was obtained for a 76 MHz repetition rate evaporation over ~250,000 laser pulses. The plume is smooth, there are no discernible disturbance in the continuous glow of carbon vapour. The exposure time for the image was 0.03 s. but it could be increased up to hours with the same result.

EXAMPLE 2

Figure 3A:
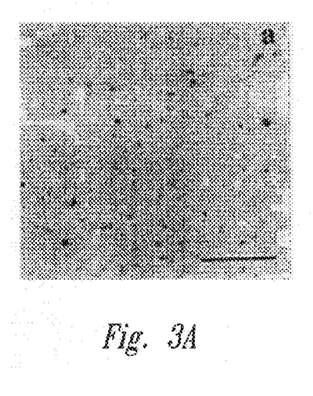
FIGS. 3(a), 3(b), and 3(c) are optical microscope images of deposited carbon film obtained in experiments using a 10 ns 30 Hz laser, a 120 ns 10 kHz laser, and a 60 ps 76 MHz laser respectively.
Figure 3B:
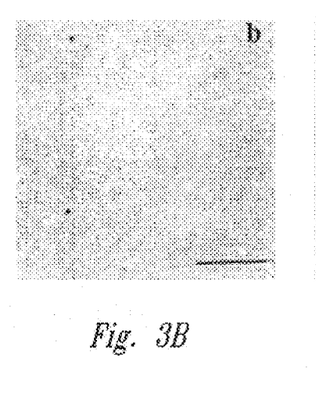
Figure 3C:
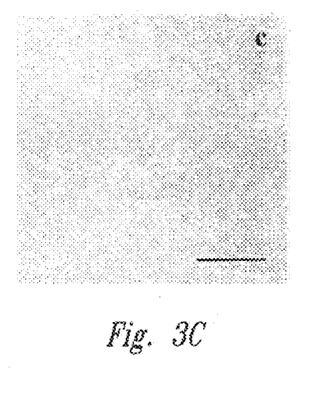

Film Surface Study with Optical Microscopy, Scanning Electron Microscopy, and Atomic Force Microscopy Optical microscope images of the thin carbon films deposited on a polished Si-wafer as a substrate using a 10 kHz, 120 ns laser, and a 60 ps, 76 MHz laser are shown in FIG. 3(b) and 3(c). For comparison, FIG. 3(a) shows an image of a substrate surface with a carbon film evaporated using the conventional method with a 10 ns 30 Hz powerful Nd:YAG laser. All the substrates were positioned at a distance of 20 mm from the target and the evaporation time was 10 mins in all experiments.

The images reveal strikingly different results on the particulate density on the substrate. The film deposited with the 30 Hz laser was covered with both spherical droplets and irregular particles in the micron size range with the particle density above 1,000 mm$^{-2}$. This is quite typical for conventional evaporation with powerful lasers. The ejection of such hot particles during the evaporation process was clearly seen as a glowing shower of "sparks" from the focal spot. By contrast, the density of micron sized particles on the substrate was less than 100 per mm$^2$ when the film was deposited with the 10 kHz evaporation. Furthermore, it was difficult to find any particles to focus the microscope on the substrate surface when examining the surface of the film deposited with 76 MHz, 60 ps laser. The occasional particle on the film at a density <1 per mm$^2$ seem to be dust particles which did not originate from the vapours.

Figure 4A:
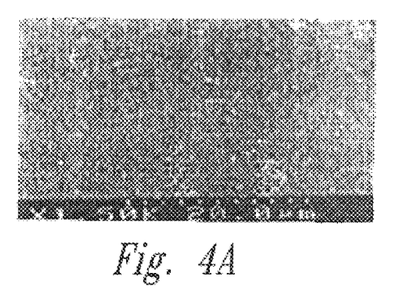
FIGS. 4(a), 4(b) 4(c) 4(d) and 4(f) are scanning electron microscope images with magnification ×1,500 (a,b); ×15,000 (c,d); and ×150,000 (e,f) of carbon films deposited with the 10 kHz laser (a,c,e) and the 76 MHz laser (b,d,f)
Figure 4B:
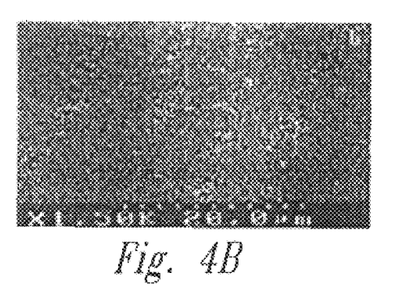
Figure 4C:
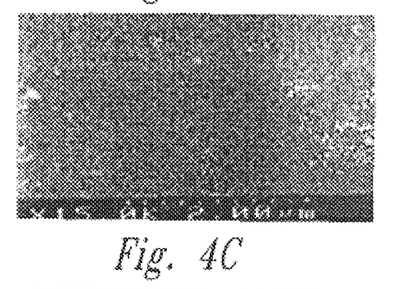
Figure 4D:
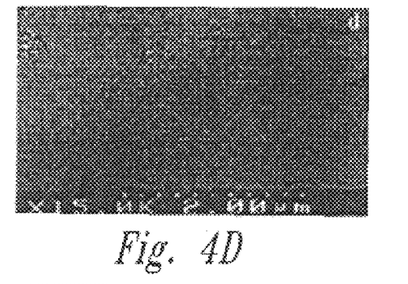
Figure 4E:
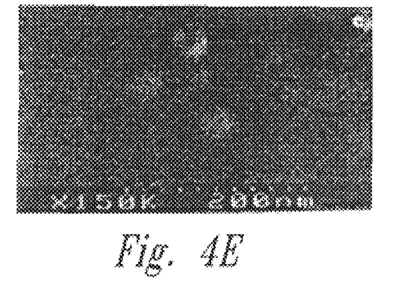
Figure 4F:
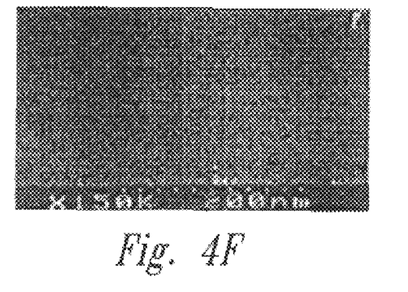

High resolution SEM (scanning electron microscope) images of 10 kHz and 76 MHz laser evaporated films are shown in FIGS. 4(a) to 4(f). FIGS. 4(a) and 4(b) are with magnification of 1,500. FIGS. 4(c) and 4(d) are with magnification of 15,000. FIGS. 4(e) and 4(f) are with magnification of 150,000. FIGS. 4(b), (d), and (f) are for films deposited with the 76 MHz laser. These images show smooth and continuous film surface with 20–100 nm size irregularities on the surface. The pictures are similar in appearance to that of diamond like carbon films produced by direct current glow discharge chemical vapour deposition (dc-CVD) process.

Figure 5A:
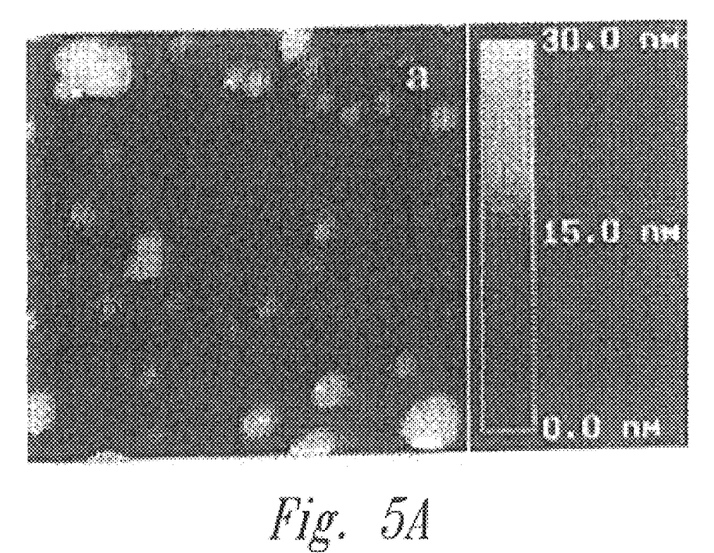
FIGS. 5(a) and 5(b) are atomic force microscope surface profiles of a 1×1 $\mu$m$^2$ area of carbon film deposited on a cleaved mica crystal with mono-atomic surface layer with a 10 kHz laser and a 76 MHz laser respectively.

Surface morphology of carbon films of 25–120 nm thickness evaporated with the 10 kHz and with the 76 MHz lasers was investigated with atomic force microscopy (AFM) in a tapping mode for better resolution. The resulting images are shown in FIG. 5(a) for the 10 kHz laser and FIG. 5(b) for the 76 MHz laser. The AFM images of the 10 kHz evaporated films reveal gently sloping "hills" on the surface with an atomically smooth flat 'valleys' in between. The size of the hills is in the range 20–100 nm, similar to those seen in the SEM images, the height is in the range 2–20 nm and seems to be independent on the film thickness, at least for the films studied. Measures of arms surface microroughness depends on the film area analysed and had a saturation-like behaviour at the level of ~12 nm. These are shown in FIG. 5(c) where the triangles are for the 10 kHz laser evaporation and the squares are for 76 MHz laser evaporation.

Figure 5B:
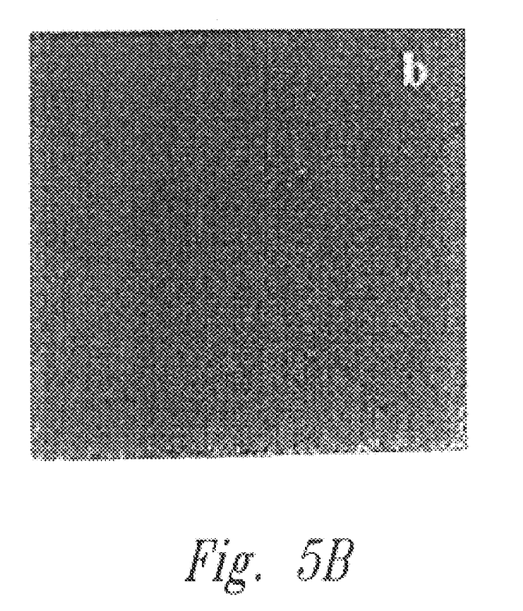
Figure 5C:
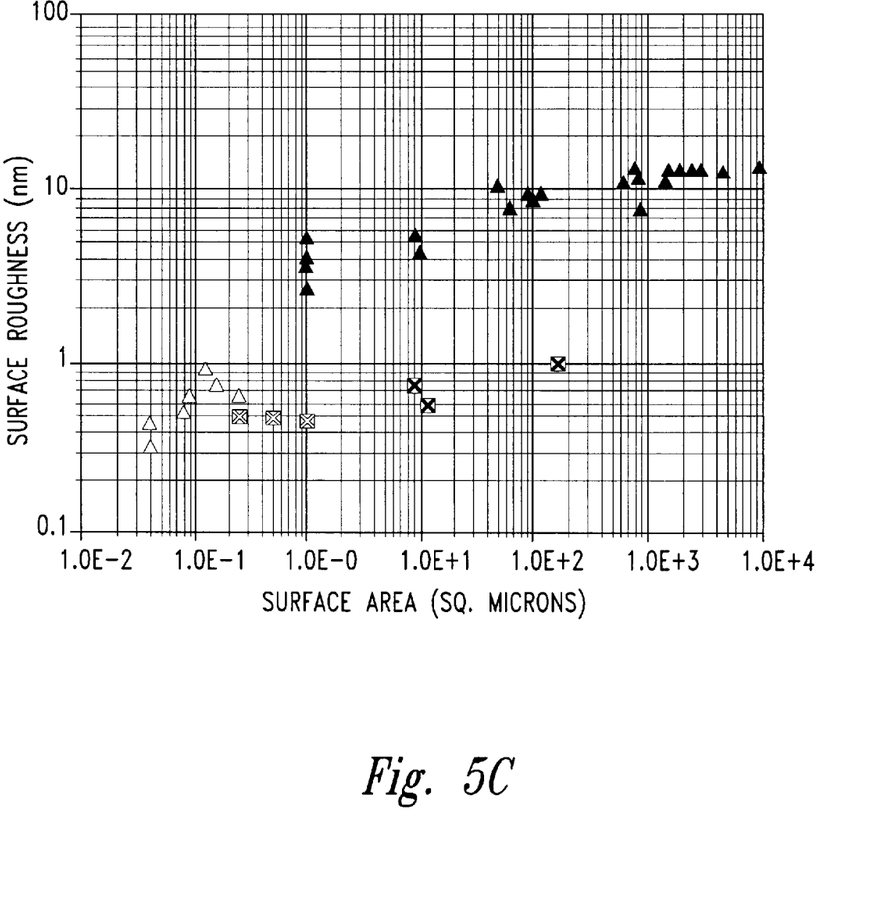
FIG. 5(c) is a graph of surface roughness versus the analysed surface area of the film for the films shown in FIGS. 5(a) and 5(b). The triangles are for 10 kHz evaporation and squares are for 76 MHz evaporation.

The 76 MHz evaporated films are almost free of submicron irregularities and appears to be almost atomically smooth with surface variations within ±1 nm as shown in FIG. 5(b). The arms roughness is at a level <1 nm over the whole measured area up to 13×13 $\mu m^2$ as shown in FIG. 5(c). The occasional particle on the surface did not influence the microroughness analysis. On the basis of these data it may be concluded that high repetition rate laser evaporation provides a way for laser deposition of particulate-free films with down to atomic level surface smoothness.

EXAMPLE 3

Deposition Rate

The monitored deposition rate on a substrate located $R_0$=150 mm from the target was in the range 2–6 Å/s for the 10 kHz laser, and 0.8–2.5 Å/s for the 76 MHz laser. To compare the rates to that for conventional deposition with low repetition rate powerful lasers it was assumed for the sake of simplicity the inverse square law for $R_0$. The carbon film deposition rate extracted from [1] for $R_0$=3 cm was 2 Å/s whilst higher rate of 3.5–5.5 Å/s was measured in [2] for $R_0$=3.5 cm. The deposition rates achieved in the experiments for 10 kHz laser evaporation are ~25 times higher than that in conventional laser deposition, and the deposition rate achieved with 76 MHz laser is 3–10 times higher. The potential exists to increase the deposition rate in ultrafast deposition technique up to 1000 times compared to that with conventional pulsed laser deposition method.

EXAMPLE 4

Thickness Homogeneity of the Deposited Film

To illustrate the homogeneity of the film thickness an amorphous carbon film was deposited simultaneously on two 4 inch silicon wafers located 150 mm from the target. The thickness of the deposited amorphous carbon film measured by optical ellipsometry was within ±5% over the area of ~250 cm$^2$.

EXAMPLE 5

Generation of Carbon Clusters

Figure 6A:
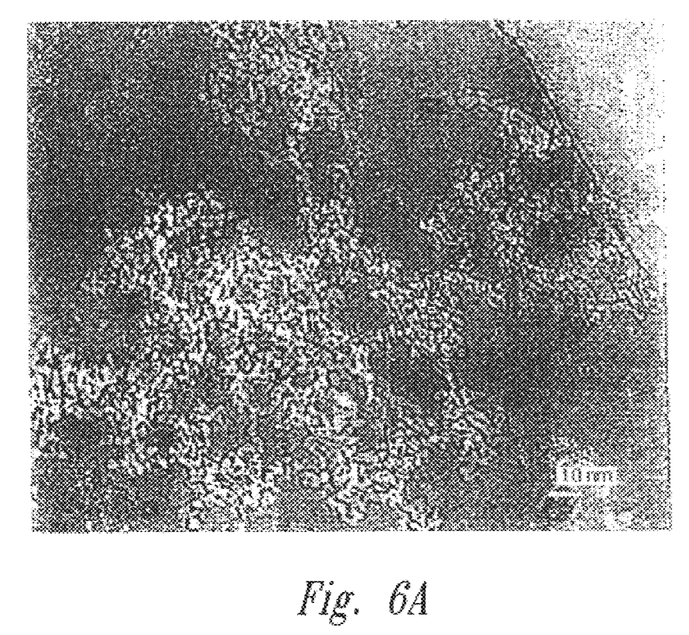
FIG. 6(a) is a Transmission Electron Microscope image and FIGS. 6(b) and 6(c) are Scanning Electron Microscope images of a carbon foam produced by laser ablation of carbon target in Argon as a buffer gas.
Figure 6B:
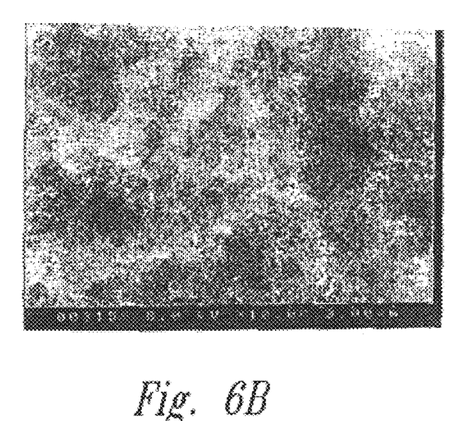
Figure 6C:
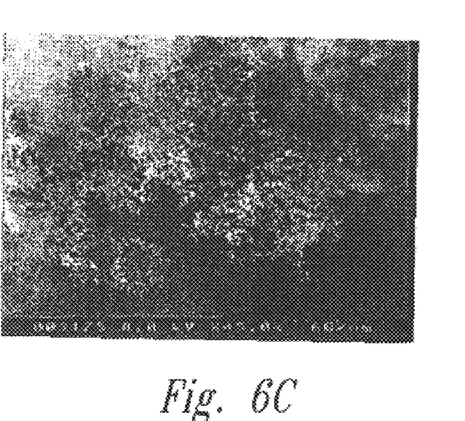

When the target chamber of the laser evaporation and deposition apparatus is filled with an inert buffer gas at the pressure approximately above 0.1 torr, the mean free path of evaporated carbon atoms in the laser plume becomes much shorter than the target to substrate distance. As a result, the carbon vapour density and the collision frequency are rising, the plume slowing relative to the propagation in vacuum, and an intense nucleation of carbon nanoclusters occurs in the laser plume. The nanoclusters produced in the experiments with 120 ns 10 kHz laser at the Ar-gas pressure 0.1–300 torr have a typical size of 6 nm in diameter, and they are self-assembled in a web-like structure resemble a foam. A typical scanning electron microscope image and a transmission electron microscope image of a nanocrystalline carbon foam are shown in FIGS. 6(a), (b), and (c). Electron energy loss spectroscopy analysis and Raman spectra of the carbon foam reveal that the clusters consist on amorphous nanoporous carbon structure with typical $sp^2/sp^3$ bonding ratio in the range 1.2–4. Carbon foam density measurements by Rutherford back-scattering technique demonstrate that the carbon foam has a characteristic density of 5–10 mg/cm$^3$, and the surface area measured with N gas is in the range 200–300 m$^2$/g. The overall speed of the carbon foam production with 10 kHz laser evaporation is in the order of 1 cm$^3$/min.

The foregoing demonstrate that the ultrafast laser ablation is a new tool for the synthesis of nanostructured thin films and new nano-materials with adjusted properties controlled by changing the size and composition of the primeval clusters.

Industrial Application

The method of this invention has potential application in the following:

1. Laser ablation and deposition of particulates-free thin films with outstanding surface quality with surface microroughness down to atomic level. The films can be dielectric, semiconducting, metallic, superconducting, compound (like oxides and nitrides), and polymer. Deposition of ultra-thin films and superlattices.
2. Laser ablation and deposition of multilayered films and epitaxial film structures of various compositions containing layers down to mono-atomic thickness. Fabrication of novel devices made from compound semiconductor epitaxial layers with a pre-designed bandgap profile—bandgap engineering.
3. Laser ablation and deposition of optical thin films for photonic applications, such as planar lasers, nonlinear optical waveguides, couples, optical gates, and all-optical switches. Fabrication at novel optical devices with a pre-designed spatial distribution of refractive index—refractive index engineering.
4. Formation of nanoclusters, nano-composite materials, and nanostructures, such as fullerene-based crystalline structures, carbon nanotubes, carbolites, low-density carbon foams, and carbon porous structures with very high surface area up to 3,000 m$^2$/g. Possible applications of carbon nanostructures are very wide, from fabrication of nanoelectronic devices to as a host material for Li-batteries with enhanced cell capacities and electronic capacitors.
5. Tribological coatings, wear protection, and hard film coatings such as diamond-like carbon coating, by ultrafast laser ablation.
6. Laser ablation and deposition of biocompatible thin films for use as dental and orthopedic implants.

References

1. W. Kautek, S. Pentzien. A. Conradi, J. Krüger, K. -W. Brzezinka, *Applied Surface Science*, 106, 158–165 (1996).
2. J. Bulir, M. Jelinek, V. Vorlicek, D. Chvostova, L. Soukur, *Journal of Non-Crystalline Solids*, 188, 188 (1995).

What is claimed is:

1. A method of deposition of thin amorphous and structural films comprising the steps of:

a) sequentially evaporating small amounts of a material to be deposited from a target of the material with each pulse of a laser irradiating the target, each pulse having an energy less than that required to evaporate sufficient of the material to result in a significant number of particles in an evaporated plume, and b) depositing the evaporated material on a substrate to form the film.

2. A method as claimed in claim 1 wherein the laser pulses have a repetition rate selected to produce a substantially continuous flow of evaporated material at the substrate.

3. A method as claimed in claim 1, wherein the laser pulses have a high repetition rate to provide a high rate of deposition of the film.

4. A method as claimed in claim 3, further comprising the step of varying the repetition rate of the laser pulses to control the rate of deposition of the film.

5. A method as claimed in any one of claims 1, 3 or 4, wherein the laser pulses have a repetition rate of about 10 kHz or greater.

6. A method as claimed in claim 1, wherein the pulse energy is selected according to the relation $$N_{evap} = \frac{E_p}{\varepsilon_b}(\text{atoms per pulse}) < N_{part};$$

where $N_{evap}$ is a number of atoms evaporated per single laser pulse and $N_{part}$ is less than about $10^{13}$ atoms.

7. A method as claimed in claim 6 wherein $N_{part}$ is less than about $10^{11}$ atoms.

8. A method as claimed in claim 1, further comprising the step of performing the evaporation and deposition in a vacuum.

9. A method as claimed in claim 1, wherein the laser pulses are scanned across the surface of the target.

10. A method as claimed in claim 9 wherein the laser pulses are scanning across the target by movement of the target.

11. A method as claimed in claim 9 wherein the laser pulses are scanned across the target by steering the laser beam.

12. A method as claimed in claim 1, further comprising the step of heating the substrate.

13. A method as claimed in claim 1, further comprising the step of performing the evaporation and deposition in a buffer gas.

14. A method as claimed in claim 13 wherein the buffer gas is inert.

15. A method as claimed in claim 13 wherein the buffer gas is reactive.

16. A method as claimed in any one at claims 13 to 15 wherein primeval clusters of evaporated material are formed in the evaporated plume.

17. A method as claimed in any one of claims 13 to 15, further comprising the step of heating the substrate and the buffer gas.

18. A method as claimed in claim 1, wherein the laser pulse duration and the laser intensity are selected according to the equation $$I_a t_p^{1/2} = a^{1/2} \rho_0 \Omega;$$

where a=+e,fra K/C+hd pρ+hd 0+ee $I_a$ is the absorbed laser intensity in [W/cm$^2$]

$t_p$ is the laser pulse duration in [s]

a is the thermal diffusion coefficient in [cm$^2$/s]

K the heat conduction coefficient in [J/(s cm K)]

$C_p$ is specific in heat [J/(g K)]

$\rho_0$ is target material density in [g/cm$^3$]

$\Omega = \epsilon_b/M$ is the heat of vaporization in [J/g]$\epsilon_b$ is the binding energy in [J], and M is the atomic mass of the target material in [g].

19. A method of forming nanocrystalline carbon foam comprising:

a) sequentially evaporating small amounts of carbon from a target with each pulse of a laser irradiating the target, each pulse having an energy less than that required to evaporate sufficient of the carbon to result in a significant number of particles in an evaporated plume, and b) depositing the evaporated material on a substrate to form the foam, wherein the evaporation and deposition are performed in a buffer gas.

20. A method as claimed in claim 19, wherein the evaporation and deposition are performed in an inert buffer gas at a pressure of about 0.1 torr.

21. A method as claimed in claim 20, wherein each laser pulse has a duration of about 120 ns and a repetition rate of about 10 kHz.

22. A method as claim in claim 19, wherein the evaporation and deposition are performed in an inert buffer gas at a pressure between about 0.1 torr and about 300 torr.

* * * * *

UNITED STATES PATENT AND TRADEMARK OFFICE
CERTIFICATE OF CORRECTION

PATENT NO. : 6,312,768 B1
DATED : November 6, 2001
INVENTOR(S) : Andrei Rode et al.

It is certified that error appears in the above-identified patent and that said Letters Patent is hereby corrected as shown below:

Column 10,
Line 16, "a=+e,fra K/C+hd pρ+hd 0=ee" should be corrected to read $-- a = \frac{K}{C_p \rho_0} --$.

Signed and Sealed this

Fourth Day of June, 2002

Attest:

Attesting Officer

JAMES E. ROGAN
*Director of the United States Patent and Trademark Office*